US010840881B2

(12) United States Patent
Takigawa

(10) Patent No.: US 10,840,881 B2
(45) Date of Patent: Nov. 17, 2020

(54) LONGITUDINALLY COUPLED RESONATOR ACOUSTIC WAVE FILTER

(71) Applicant: Murata Manufacturing Co., Ltd., Nagaokakyo (JP)

(72) Inventor: Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/452,566

(22) Filed: Jun. 26, 2019

(65) Prior Publication Data

US 2019/0319601 A1    Oct. 17, 2019

Related U.S. Application Data

(63) Continuation of application No. PCT/JP2017/045115, filed on Dec. 15, 2017.

(30) Foreign Application Priority Data

Dec. 28, 2016   (JP) .................................. 2016-256345

(51) Int. Cl.
    *H03H 9/145* (2006.01)
    *H03H 9/02* (2006.01)
    *H03H 9/64* (2006.01)

(52) U.S. Cl.
    CPC .... *H03H 9/14564* (2013.01); *H03H 9/02543* (2013.01); *H03H 9/02559* (2013.01); *H03H 9/64* (2013.01)

(58) Field of Classification Search
    CPC ........... H03H 9/14564; H03H 9/02543; H03H 9/02559; H03H 9/64
    (Continued)

(56) References Cited

U.S. PATENT DOCUMENTS

| 10,469,050 B2 * | 11/2019 | Gamble ............ H03H 9/02015 |
| 2008/0238576 A1 | 10/2008 | Takahashi et al. |

(Continued)

FOREIGN PATENT DOCUMENTS

| JP | 2008-252678 A | 10/2008 |
| JP | 5861809 B1 | 2/2016 |
| WO | 2015/182522 A1 | 12/2015 |

OTHER PUBLICATIONS

"High speed Digital System Design, Art Science and Experience", by Belous et al., published by Springer, Switzerland in 2020 (Year: 2020).*

(Continued)

*Primary Examiner* — Benny T Lee
*Assistant Examiner* — Hafizur Rahman
(74) *Attorney, Agent, or Firm* — Keating & Bennett, LLP

(57) ABSTRACT

A longitudinally coupled resonator acoustic wave filter includes first, second, and third IDT electrodes disposed on a piezoelectric substrate. The first, second, and third IDT electrodes include first electrode fingers and second electrode fingers. The first, second, and third IDT electrodes include narrow-pitch electrode finger portions in which the pitch between electrode fingers is narrower than in the remaining electrode finger portions. In the first, second, and third IDT electrodes, an overlap area includes a central area and first and second edge areas at opposite ends of the central area in the direction in which the first and second electrode fingers extend. In the remaining electrode finger portions the first electrode fingers and the second electrode fingers include wide portions in the first or second edge area.

12 Claims, 4 Drawing Sheets

(58) Field of Classification Search
USPC .......................................................... 333/193
See application file for complete search history.

(56) References Cited

U.S. PATENT DOCUMENTS

| | | |
|---|---|---|
| 2009/0121810 A1 | 5/2009 | Fujii et al. |
| 2013/0249647 A1* | 9/2013 | Nakanishi .......... H03H 9/02559 |
| | | 333/186 |
| 2017/0047905 A1 | 2/2017 | Kraki et al. |

OTHER PUBLICATIONS

Official Communication issued in International Patent Application No. PCT/JP20171045115, dated Feb. 27, 2018.

* cited by examiner

LONGITUDINALLY COUPLED RESONATOR ACOUSTIC WAVE FILTER

CROSS REFERENCE TO RELATED APPLICATIONS

This application claims the benefit of priority to Japanese Patent Application No. 2016-256345 filed on Dec. 28, 2016 and is a Continuation Application of PCT Application No. PCT/JP2017/045115 filed on Dec. 15, 2017. The entire contents of each application are hereby incorporated herein by reference.

BACKGROUND OF THE INVENTION

1. Field of the Invention

The present invention relates to a longitudinally coupled resonator acoustic wave filter including a narrow-pitch electrode finger portion.

2. Description of the Related Art

In the related art, piston modes have been used to prevent or reduce ripples that are caused by transverse modes. For example, WO2015/182522A1 discloses longitudinally coupled resonator acoustic wave filters using piston modes. Each of the longitudinally coupled resonator acoustic wave filters disclosed in WO2015/182522A1 includes interdigital transducer (IDT) electrodes, and each of the IDT electrodes includes an overlap area that includes a central area and the first and second edge areas disposed at opposite ends of the central area in the direction in which electrode fingers extend. Each first electrode finger includes a wide portion in the second edge area, the wide portion being wider than the remaining portion of the first electrode finger. Each second electrode finger includes a wide portion in the first edge area.

In an IDT electrode including a narrow-pitch electrode finger portion, the pitch of electrode fingers is narrower in the narrow-pitch electrode finger portion than in the remaining electrode finger portion, and the propagation velocity of an acoustic wave changes in the propagation direction of the acoustic wave. A structure in which the length and width of electrode areas are fixed is effective for a single propagation velocity of the acoustic wave, but ineffective in a portion where the propagation velocity of the acoustic wave is different. Thus, ripples that are caused by transverse modes are not sufficiently reduced in an IDT electrode including a narrow-pitch electrode finger portion. Accordingly, WO2015/182522A1 discloses a structure in which the width of the wide portions in the edge areas is different in each of the narrow-pitch electrode finger portion and the remaining electrode finger portion.

However, if wide portions are disposed in a narrow-pitch electrode finger portion, as in WO2015/182522A1, the spacing between a wide portion and an adjacent electrode finger becomes narrow. Thus, the electric power handling capability is decreased.

Forming an edge area by disposing a mass-adding layer, instead of a wide portion, is feasible. However, in such a case, the gap aspect ratio increases in the edge area in a narrow-pitch electrode finger portion. Thus, the film quality deteriorates, which degrades the weather resistance.

SUMMARY OF THE INVENTION

Preferred embodiments of the present invention provide longitudinally coupled resonator acoustic wave filters whose electric power handling capability and weather resistance do not easily deteriorate.

A longitudinally coupled resonator acoustic wave filter according to a preferred embodiment of the present invention includes a piezoelectric substrate, a plurality of IDT electrodes disposed on the piezoelectric substrate, and a pair of reflectors disposed in a propagation direction of an acoustic wave at opposite ends of an area in which the plurality of IDT electrodes are disposed. Each of the plurality of IDT electrodes includes a first busbar and a second busbar that face each other, a plurality of first electrode fingers connected to the first busbar at one end of each of the plurality of first electrode fingers, and a plurality of second electrode fingers connected to the second busbar at one end of each of the plurality of second electrode fingers, and each of the plurality of first electrode fingers and each of the plurality of second electrode fingers are interdigitated with each other. Each of the plurality of IDT electrodes includes a narrow-pitch electrode finger portion and a remaining electrode finger portion, and a pitch between electrode fingers is narrower in the narrow-pitch electrode finger portion than in the remaining electrode finger portion. An area in which the plurality of first electrode fingers and the plurality of second electrode fingers overlap when viewed in the propagation direction of the acoustic wave is referred to as an overlap area. The overlap area includes a central area, a first edge area, and a second edge area arranged in a direction in which the plurality of first electrode fingers and the plurality of second electrode fingers extend, and the first edge area and the second edge area are disposed at opposite ends of the central area in the direction in which the plurality of first electrode fingers and the plurality of second electrode fingers extend. In the remaining electrode finger portion, each of the plurality of first electrode fingers and each of the plurality of second electrode fingers include a wide portion in the first edge area and in the second edge area. The wide portion of each of the plurality of first electrode fingers is wider than a remaining portion of each of the plurality of first electrode fingers, and the wide portion of each of the plurality of second electrode fingers is wider than a remaining portion of each of the plurality of second electrode fingers. In the narrow-pitch electrode finger portion, none of the plurality of first electrode fingers and none of the plurality of second electrode fingers include a wide portion.

In a longitudinally coupled resonator acoustic wave filter according to a preferred embodiment of the present invention, each of the plurality of first electrode fingers in the remaining electrode finger portion includes the wide portion in the second edge area, and each of the plurality of second electrode fingers in the remaining electrode finger portion includes the wide portion in the first edge area.

In a longitudinally coupled resonator acoustic wave filter according to a preferred embodiment of the present invention, in the remaining electrode finger portion, each of the plurality of first electrode fingers and each of the plurality of second electrode fingers include the wide portion in both of the first edge area and the second edge area. This configuration more effectively reduces or prevents ripples that are caused by transverse modes.

In a longitudinally coupled resonator acoustic wave filter according to a preferred embodiment of the present invention, first to third IDT electrodes are provided as the plurality of IDT electrodes, and the first to third IDT electrodes are arranged in order in the propagation direction of the acoustic wave.

In a longitudinally coupled resonator acoustic wave filter according to a preferred embodiment of the present invention, first to fifth IDT electrodes are provided as the plurality of IDT electrodes, and the first to fifth IDT electrodes are arranged in order in the propagation direction of the acoustic wave.

In a longitudinally coupled resonator acoustic wave filter according to a preferred embodiment of the present invention, first to ninth IDT electrodes are provided as the plurality of IDT electrodes, and the first to ninth IDT electrodes are arranged in order in the propagation direction of the acoustic wave.

According to preferred embodiments of the present invention, longitudinally coupled resonator acoustic wave filters are provided whose electric power handling capability and weather resistance do not easily deteriorate, while preventing or reducing ripples that are caused by transverse modes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

It is to be understood that the preferred embodiments are described in the specification for illustrative purposes and that partial substitutions or combinations of elements illustrated in different preferred embodiments are feasible.

Figure 1:
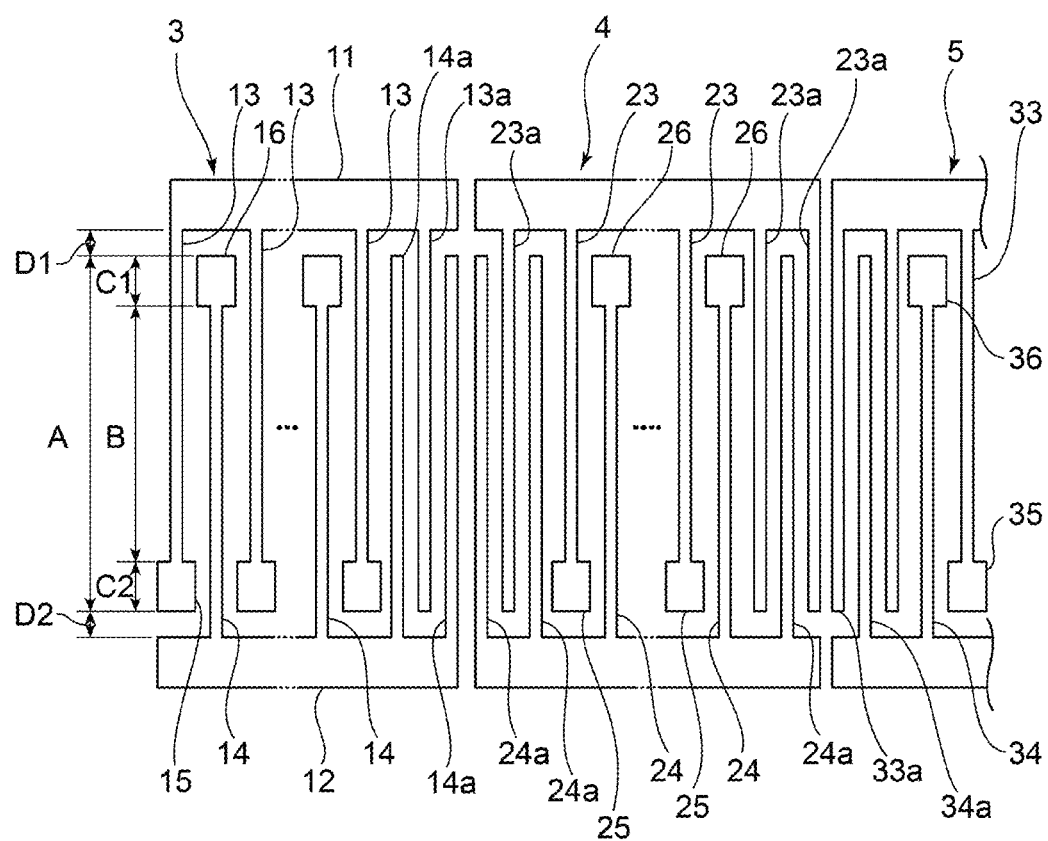
FIG. 1 is a partial cutaway plan view depicting the main portion of the electrode structure of a longitudinally coupled resonator acoustic wave filter according to a first preferred embodiment of the present invention.
Figure 2:
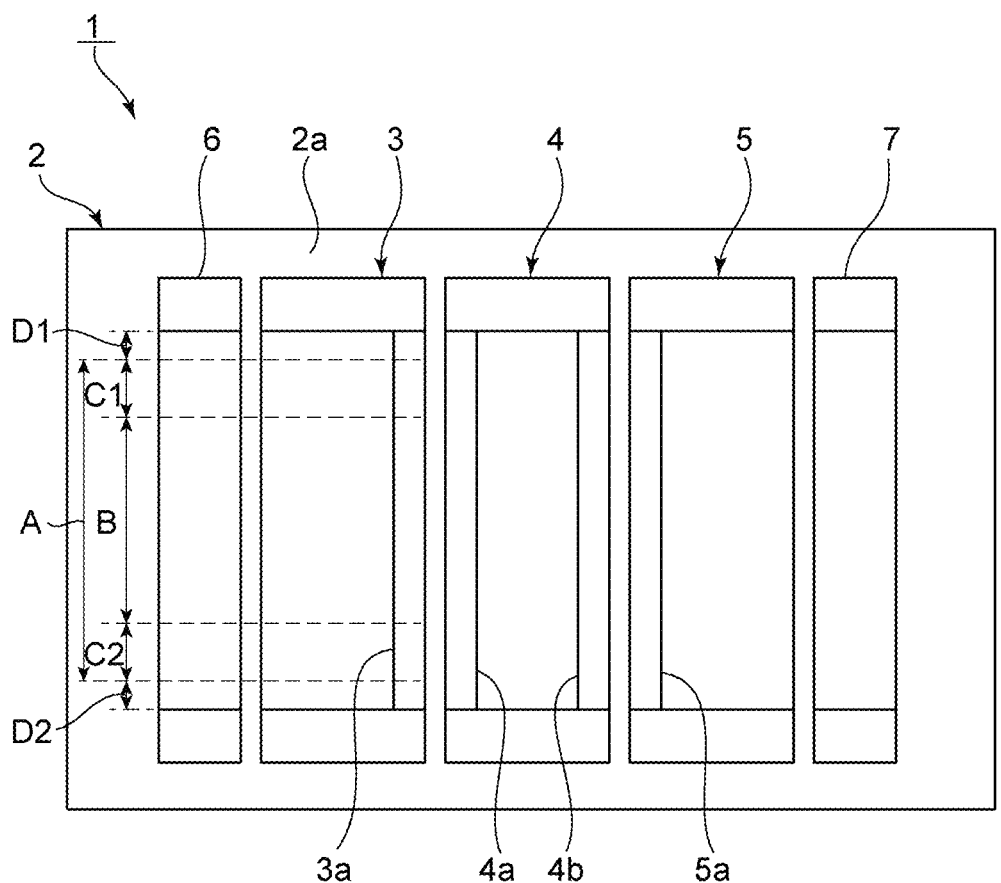
FIG. 2 is a schematic plan view of the longitudinally coupled resonator acoustic wave filter according to the first preferred embodiment of the present invention.

FIG. 1 is a partial cutaway plan view depicting the main portion of the electrode structure of a longitudinally coupled resonator acoustic wave filter according to a first preferred embodiment of the present invention, and FIG. 2 is a schematic plan view of the longitudinally coupled resonator acoustic wave filter according to the first preferred embodiment.

As depicted in FIG. 2, a longitudinally coupled resonator acoustic wave filter 1 includes a first IDT electrode 3, a second IDT electrode 4, and a third IDT electrode 5 arranged in order in the propagation direction of an acoustic wave on a top surface 2a of a piezoelectric substrate 2. Reflectors 6 and 7 are disposed in the propagation direction of the acoustic wave at opposite ends of the area in which the first, second, and third IDT electrodes 3, 4, and 5 are disposed. The longitudinally coupled resonator acoustic wave filter 1 is preferably a 3-IDT longitudinally coupled resonator acoustic wave filter including the first, second, and third IDT electrodes 3, 4, and 5.

As depicted in FIG. 1, the first IDT electrode 3 includes a first busbar 11 and a second busbar 12, which face each other. A plurality of first electrode fingers 13 are connected to the first busbar 11 at one end of each of the plurality of first electrode fingers 13. A plurality of second electrode fingers 14 are connected to the second busbar 12 at one end of each of the plurality of second electrode fingers 14. Each of the plurality of first electrode fingers 13 and each of the plurality of second electrode fingers 14 are interdigitated with each other.

The first IDT electrode 3 includes a narrow-pitch electrode finger portion at an end portion facing the second IDT electrode 4. In the narrow-pitch electrode finger portion, at least one first electrode finger 13a and at least one second electrode finger 14a are arranged alternately in the propagation direction of the acoustic wave at a pitch narrower than the pitch in the remaining electrode finger portion.

In the first IDT electrode 3, each of the first electrode fingers 13 and each of the second electrode fingers 14 include wide portions 15 and 16, respectively, in the remaining electrode finger portion, which is a portion other than the narrow-pitch electrode finger portion. The area in which the first electrode fingers 13 and the second electrode fingers 14 overlap when viewed in the propagation direction of the acoustic wave is referred to as an overlap area A. The overlap area A includes a central area B located in the central portion in the direction in which the first and second electrode fingers 13 and 14 extend and first and second edge areas C1 and C2 disposed at opposite ends of the central area B.

Regarding the wide portions 15 and 16, the dimensions in the direction in which the first and second electrode fingers 13 and 14 extend are referred to as the lengths of the wide portions 15 and 16, and the dimensions in the propagation direction of the acoustic wave are referred to as the widths of the wide portions 15 and 16. The dimension of the first edge area C1 in the direction in which the first and second electrode fingers 13 and 14 extend is the length of the wide portion 16. The dimension of the second edge area C2 in the direction in which the first and second electrode fingers 13 and 14 extend is the length of the wide portion 15.

Since the wide portion 16 is provided, the acoustic velocity is lower in the first edge area C1 than in the central area B, where no wide portion is disposed. Similarly, since the wide portion 15 is provided, the acoustic velocity is lower in the second edge area C2 than in the central area B. A high-acoustic-velocity area D1 is disposed outside the first edge area C1. The acoustic velocity is higher in the high-acoustic-velocity area D1 than in the edge area C1. Similarly, a high-acoustic-velocity area D2 is disposed on the second busbar 12 side.

Similarly, the second IDT electrode 4 also includes a plurality of first electrode fingers 23 and a plurality of second electrode fingers 24. Each of the plurality of first electrode fingers 23 includes a wide portion 25 other than in narrow-pitch electrode finger portion. Each of the plurality of second electrode fingers 24 includes a wide portion 26 other than in narrow-pitch electrode finger portion.

Similarly, in the third IDT electrode 5, each first electrode finger 33 includes a wide portion 35 other than in narrow-pitch electrode finger portion. Each second electrode finger 34 includes a wide portion other than in narrow-pitch electrode finger portion 36.

Thus, since the longitudinally coupled resonator acoustic wave filter 1 has a piston mode structure, ripples that are caused by higher-order transverse modes are able to be prevented or reduced.

In addition, the first IDT electrode 3 includes the narrow-pitch electrode finger portion, in which the first and second electrode fingers 13a and 14a are alternately arranged. The second IDT electrode 4 also includes a narrow-pitch electrode finger portion at an end portion facing the first IDT electrode 3 and at an end portion facing the third IDT electrode 5. A narrow-pitch electrode finger portion 3a, 4a, 4b, and 5a is disposed at each end portion of an IDT electrode in a region in which the first IDT electrode 3 and the second IDT electrode 4 are adjacent to each other and in a region in which the second IDT electrode 4 and the third IDT electrode 5 are adjacent to each other. Providing these narrow-pitch electrode finger portions 3a, 4a, 4b, and 5a contributes to obtaining a wide bandwidth and improving insertion loss.

A feature of the longitudinally coupled resonator acoustic wave filter 1 is that no wide portion is disposed in the narrow-pitch electrode finger portions. More specifically, in the first IDT electrode 3, the at least one first electrode finger 13a and the at least one second electrode finger 14a, which define the narrow-pitch electrode finger portion, include no wide portion. In the second IDT electrode 4, at least one first electrode finger 23a and at least one second electrode finger 24a also include no wide portion. In the third IDT electrode 5, at least one first electrode finger 33a and at least one second electrode finger 34a also include no wide portion.

The pitch between electrode fingers is narrower in a narrow-pitch electrode finger portion than in the remaining electrode finger portion, which is the main electrode finger portion. If a wide portion is disposed in a narrow-pitch electrode finger portion, the spacing between a wide portion and an electrode finger adjacent to a wide portion becomes narrow. Thus, the surge resistance decreases, and the electric power handling capability decreases.

In contrast, in the longitudinally coupled resonator acoustic wave filter 1, no wide portion is provided in the narrow-pitch electrode finger portions. Thus, the electric power handling capability is able to be improved. For example, in the first IDT electrode 3, the spacing between the first electrode finger 13a and each of the second electrode fingers 14a corresponds to the pitch between electrode fingers in the narrow-pitch electrode finger portion and is able to be sufficiently increased because no wide portion is provided. The increase in the spacing is effective to increase the electric power handling capability.

The above description also applies to the second IDT electrode 4 and the third IDT electrode 5. Accordingly, no mass-adding layer is disposed on the at least one of the first electrode finger 13a and the at least one of the second electrode finger 14a in the first and second edge areas C1 and C2.

Further, when a protective layer is provided on the first, second, and third IDT electrodes 3, 4, and 5, the protective layer quality does not easily deteriorate. Thus, the weather resistance does not easily deteriorate either.

Figure 5:
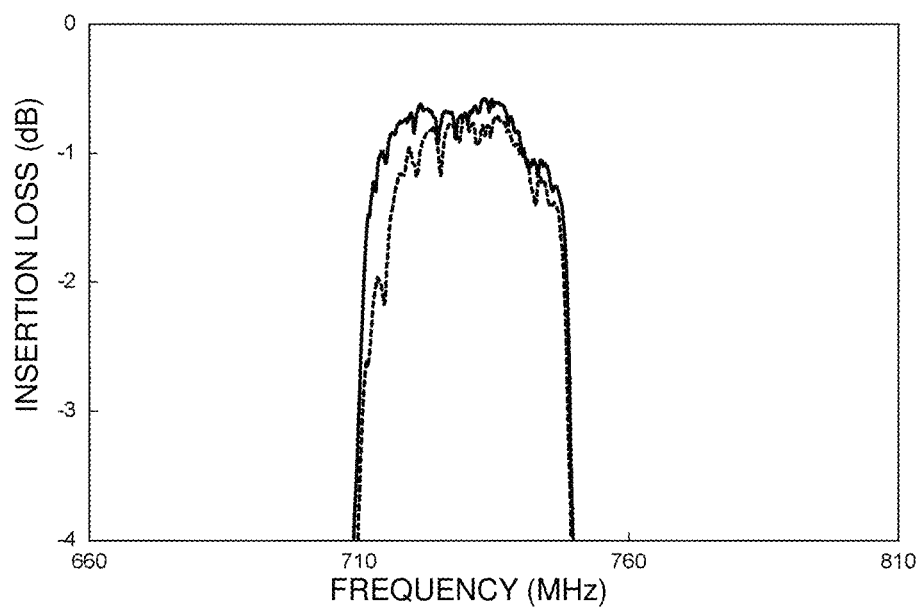
FIG. 5 depicts filter characteristics of an example according to a second preferred embodiment of the present invention and a comparative example.

FIG. 5 depicts filter characteristics of an example according to a second preferred embodiment of the present invention and a comparative example. A longitudinally coupled resonator acoustic wave filter in this example includes the first to ninth IDT electrodes arranged in the propagation direction of the acoustic wave. The second preferred embodiment is the same or substantially the same as the first preferred embodiment except that the nine IDT electrodes are provided instead of the three IDT electrodes. In FIG. 5, the solid line indicates the result for the example, and the dashed line indicates the result for the comparative example. The design parameters of the longitudinally coupled resonator acoustic wave filter 1 according to the example are listed in Table 1. In Table 1, the text "Main" indicates an electrode finger portion other than a narrow-pitch electrode finger portion. The text "Narrow pitch" indicates a narrow-pitch electrode finger portion.

TABLE 1

| | | Wavelength (μm) | Duty | Number of electrode fingers |
|---|---|---|---|---|
| Reflector | | 1.994453 | 0.475 | 21 |
| First IDT electrode | Main | 1.96558 | 0.475 | 41 |
| First IDT electrode | Narrow pitch | 1.80717 | 0.475 | 3 |
| Second IDT electrode | Narrow pitch | 1.75848 | 0.475 | 3 |
| Second IDT electrode | Main | 1.96616 | 0.475 | 33 |
| Second IDT electrode | Narrow pitch | 1.8447 | 0.475 | 7 |
| Third IDT electrode | Narrow pitch | 1.86231 | 0.475 | 9 |
| Third IDT electrode | Main | 1.9706 | 0.475 | 49 |
| Third IDT electrode | Main | 1.96777 | 0.475 | 12 |
| Third IDT electrode | Narrow pitch | 1.74287 | 0.475 | 3 |
| Fourth IDT electrode | Narrow pitch | 1.87132 | 0.475 | 5 |
| Fourth IDT electrode | Main | 1.96018 | 0.475 | 31 |
| Fourth IDT electrode | Narrow pitch | 1.84656 | 0.475 | 7 |
| Fifth IDT electrode | Narrow pitch | 1.87134 | 0.475 | 9 |
| Fifth IDT electrode | Main | 1.96643 | 0.475 | 41 |
| Fifth IDT electrode | Main | 1.97142 | 0.475 | 26 |
| Fifth IDT electrode | Narrow pitch | 1.86189 | 0.475 | 9 |
| Sixth IDT electrode | Narrow pitch | 1.84864 | 0.475 | 7 |
| Sixth IDT electrode | Main | 1.97964 | 0.475 | 33 |
| Sixth IDT electrode | Narrow pitch | 1.85491 | 0.475 | 5 |
| Seventh IDT electrode | Narrow pitch | 1.74848 | 0.475 | 3 |
| Seventh IDT electrode | Main | 1.97402 | 0.475 | 10 |
| Seventh IDT electrode | Main | 1.96541 | 0.475 | 31 |
| Seventh IDT electrode | Narrow pitch | 1.8712 | 0.475 | 9 |
| Eighth IDT electrode | Narrow pitch | 1.84697 | 0.475 | 7 |
| Eighth IDT electrode | Main | 1.96279 | 0.475 | 27 |
| Eighth IDT electrode | Narrow pitch | 1.8436 | 0.475 | 3 |
| Ninth IDT electrode | Narrow pitch | 1.75014 | 0.475 | 3 |
| Ninth IDT electrode | Main | 1.97133 | 0.475 | 49 |
| Reflector | | 1.994453 | 0.475 | 21 |

The overlap width of electrode fingers in the first to ninth IDT electrodes is about 40.59 μm, for example. The piezoelectric substrate is a LiNbO$_3$ substrate with a cut-angle of about −11°, for example Further, an approximately 11-nm-thick SiO$_2$ layer is laminated on the LiNbO$_3$ substrate, for example. The laminated structure of the IDT electrodes and reflectors includes, in order from the bottom, an approximately 10-nm-thick NiCr layer, an approximately 49-nm-thick Pt layer, an approximately 10-nm-thick Ti layer, an approximately 200-nm-thick AlCu layer, and an approximately 10-nm-thick Ti layer, for example.

The comparative example of the longitudinally coupled resonator acoustic wave filter is the same or substantially the same as the example described above except that wide portions are also provided in the narrow-pitch portions.

It is evident from FIG. 5 that the filter characteristics of the example are comparable to the filter characteristics of the comparative example. Accordingly, the longitudinally coupled resonator acoustic wave filter is able to prevent or reduce ripples that are caused by transverse modes and provide favorable filter characteristics. Further, the electric power handling capability and the weather resistance do not easily deteriorate.

Figure 3:
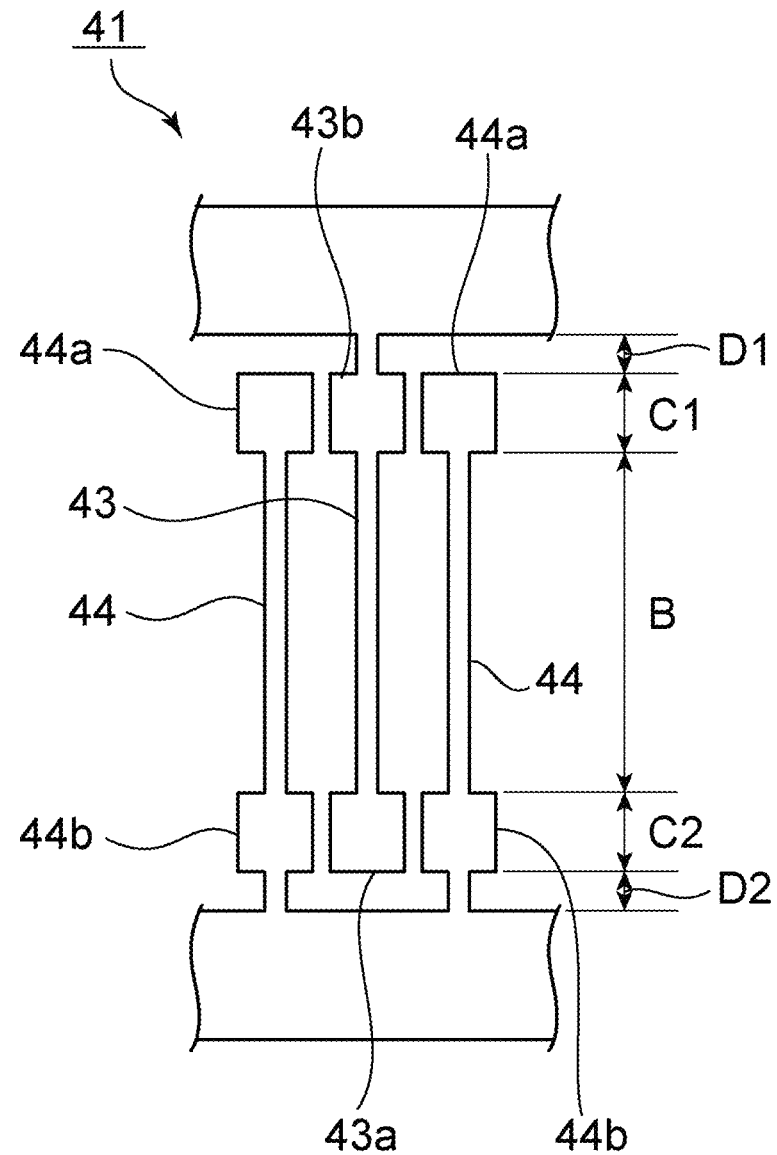
FIG. 3 is a partial cutaway plan view depicting the main portion of the electrode structure of a longitudinally coupled resonator acoustic wave filter according to a third preferred embodiment of the present invention.

FIG. 3 is a partial cutaway plan view depicting the main portion of the electrode structure of a longitudinally coupled resonator acoustic wave filter according to a third preferred embodiment of the present invention. A first IDT electrode 41 of the longitudinally coupled resonator acoustic wave filter according to the third preferred embodiment includes first electrode fingers 43 and second electrode fingers 44, each of the first electrode fingers 43 and each of the second electrode fingers 44 being interdigitated with each other. In FIG. 3, illustration of narrow-pitch electrode finger portions is omitted.

Each of the first electrode fingers 43 includes a wide portion 43*a* on the leading edge side. Specifically, the wide portion 43*a* is provided in the second edge area C2. In addition, a wide portion 43*b* is also provided in the first edge area C1. Similarly, each of the second electrode fingers 44 also includes a wide portion 44*a* provided in the first edge area C1 and a wide portion 44*b* provided in the second edge area C2.

Also in a second IDT electrode and a third IDT electrode, each of the first electrode fingers and each of the second electrode fingers include wide portions in both of the first edge area C1 and the second edge area C2 in the main electrode finger portion, which is a portion other than the narrow-pitch electrode finger portions. Providing a wide portion in this manner in both of the first edge area C1 and the second edge area C2 more effectively reduces or prevents ripples that are caused by transverse modes.

Similarly to the first preferred embodiment, also in the longitudinally coupled resonator acoustic wave filter according to the third preferred embodiment, no wide portion is provided in the narrow-pitch electrode finger portions. Accordingly, similarly to the first preferred embodiment, the longitudinally coupled resonator acoustic wave filter is able to prevent or reduce ripples that are caused by transverse modes, and the electric power handling capability and the weather resistance do not easily deteriorate.

Figure 4:
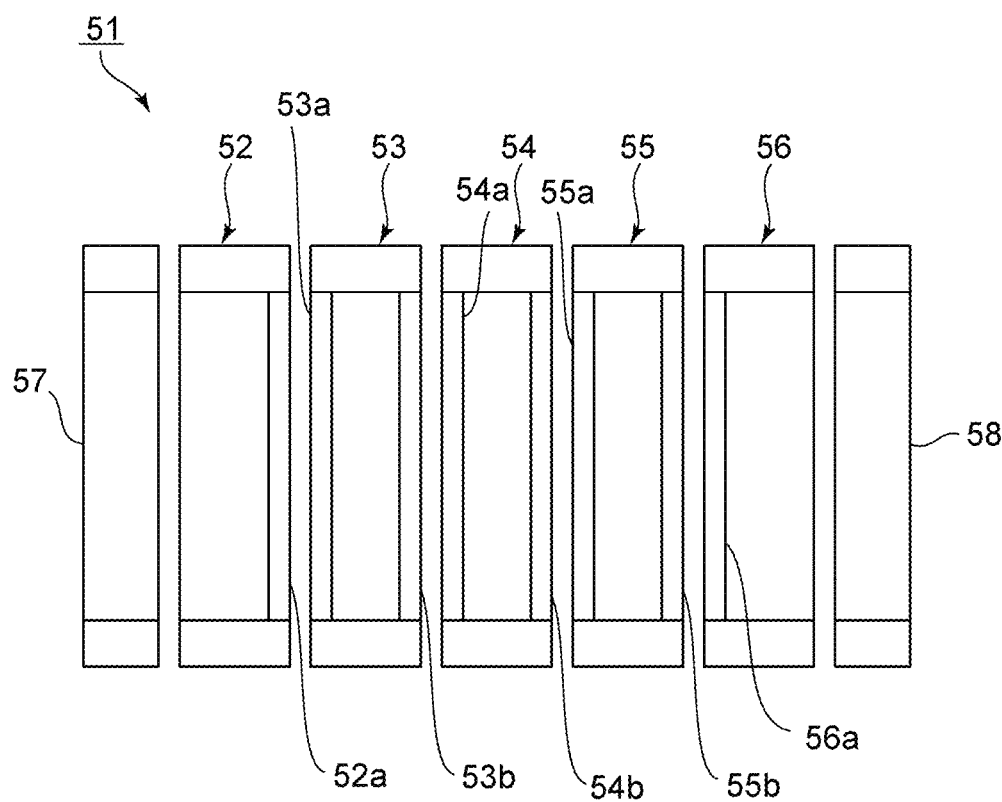
FIG. 4 is a schematic plan view of a longitudinally coupled resonator acoustic wave filter according to a fourth preferred embodiment of the present invention.

FIG. 4 is a schematic plan view of a longitudinally coupled resonator acoustic wave filter according to a fourth preferred embodiment of the present invention. A longitudinally coupled resonator acoustic wave filter 51 according to the fourth preferred embodiment includes the first to fifth IDT electrodes 52 to 56 arranged in order in the propagation direction of the acoustic wave. Reflectors 57 and 58 are disposed in the propagation direction of the acoustic wave at opposite ends of the area where the first to fifth IDT electrodes 52 to 56 are disposed. The present preferred embodiment is the same or substantially the same as the longitudinally coupled resonator acoustic wave filter 1 according to the first preferred embodiment, except that the five IDT electrodes are disposed. Specifically, no wide portion is provided in narrow-pitch electrode finger portions 52*a*, 53*a*, 53*b*, 54*a*, 54*b*, 55*a*, 55*b*, and 56*a*. Similarly to the first preferred embodiment, wide portions are provided in the remaining electrode finger portions.

Accordingly, the longitudinally coupled resonator acoustic wave filter 51 is also able to effectively prevent or reduce ripples that are caused by transverse modes, and the electric power handling capability and the weather resistance do not easily deteriorate.

A substrate preferably made of a piezoelectric single crystal, such as LiTaO$_3$ and LiNbO$_3$, for example, may be used as the piezoelectric substrate 2. Piezoelectric ceramics may be used in place of a piezoelectric single crystal. Further, a piezoelectric substrate including a piezoelectric layer laminated on a support substrate may be used. The piezoelectric single crystal described above or the like may be used as appropriate as the piezoelectric layer.

The first, second, and third IDT electrodes 3, 4, and 5 and the reflectors 6 and 7 are preferably made of suitable metal or alloy. A dielectric layer or a protective layer, such as SiO$_2$, which is not depicted, may preferably be laminated so as to cover the first, second, and third IDT electrodes 3, 4, and 5.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator acoustic wave filter comprising:
   a piezoelectric substrate;
   a plurality of IDT electrodes disposed on the piezoelectric substrate; and
   a pair of reflectors disposed in a propagation direction of an acoustic wave at opposite ends of an area in which the plurality of IDT electrodes are disposed; wherein
   each of the plurality of IDT electrodes includes:
      a first busbar and a second busbar that face each other;
      a plurality of first electrode fingers connected to the first busbar at one end of each of the plurality of first electrode fingers; and
      a plurality of second electrode fingers connected to the second busbar at one end of each of the plurality of second electrode fingers; wherein
      each of the plurality of first electrode fingers and each of the plurality of second electrode fingers are interleaved with each other;
   each of the plurality of IDT electrodes includes a narrow-pitch electrode finger portion and a remaining electrode finger portion, and a pitch between electrode fingers is narrower in the narrow-pitch electrode finger portion than in the remaining electrode finger portion;
   an area in which the plurality of first electrode fingers and the plurality of second electrode fingers overlap when viewed in the propagation direction of the acoustic wave defines an overlap area, and the overlap area includes a central area, a first edge area, and a second edge area arranged in a direction in which the plurality of first electrode fingers and the plurality of second electrode fingers extend, the first edge area and the second edge area being disposed at opposite ends of the central area in the direction in which the plurality of first electrode fingers and the plurality of second electrode fingers extend;
   in the remaining electrode finger portion, each of the plurality of first electrode fingers and each of the plurality of second electrode fingers include a wide portion in at least one of the first edge area and in the second edge area, the wide portion of each of the plurality of first electrode fingers being wider than a remaining portion of each of the plurality of first electrode fingers and the wide portion of each of the plurality of second electrode fingers being wider than a remaining portion of each of the plurality of second electrode fingers; and
   in the narrow-pitch electrode finger portion, none of the plurality of first electrode fingers and none of the plurality of second electrode fingers include a wide portion.

2. The longitudinally coupled resonator acoustic wave filter according to claim 1, wherein the piezoelectric substrate is made of LiTaO$_3$ or LiNbO$_3$.

3. The longitudinally coupled resonator acoustic wave filter according to claim 1, wherein, in the remaining electrode finger portion, each of the plurality of first electrode fingers and each of the plurality of second electrode fingers include the wide portion in both of the first edge area and the second edge area.

4. The longitudinally coupled resonator acoustic wave filter according to claim 1, wherein the plurality of IDT electrodes include first, second, and third IDT electrodes arranged in order in the propagation direction of the acoustic wave.

5. The longitudinally coupled resonator acoustic wave filter according to claim 1, wherein the plurality of IDT electrodes include first, second, third, fourth, and fifth IDT electrodes arranged in order in the propagation direction of the acoustic wave.

6. The longitudinally coupled resonator acoustic wave filter according to claim 1, wherein the plurality of IDT electrodes include first, second, third, fourth, fifth, sixth, seventh, eighth, and ninth IDT electrodes arranged in order in the propagation direction of the acoustic wave.

7. The longitudinally coupled resonator acoustic wave filter according to claim 1, wherein the narrow-pitch electrode finger portion of each of the plurality of IDT electrodes is disposed at at least one end portion of the respective IDT electrode in the propagation direction of the acoustic wave.

8. The longitudinally coupled resonator acoustic wave filter according to claim 1, wherein the narrow-pitch electrode finger portion of each of the plurality of IDT electrodes is disposed at each end portion of the respective IDT electrode in the propagation direction of the acoustic wave.

9. The longitudinally coupled resonator acoustic wave filter according to claim 1, wherein a protective layer is provided on each of the plurality of IDT electrodes.

10. The longitudinally coupled resonator acoustic wave filter according to claim 9, wherein the protective layer is made of $SiO_2$.

11. The longitudinally coupled resonator acoustic wave filter according to claim 1, wherein each of the plurality of first electrode fingers in the remaining electrode finger portion includes the wide portion in the second edge area, and each of the plurality of second electrode fingers in the remaining electrode finger portion includes the wide portion in the first edge area.

12. The longitudinally coupled resonator acoustic wave filter according to claim 11, wherein, in the remaining electrode finger portion, each of the plurality of first electrode fingers and each of the plurality of second electrode fingers include the wide portion in both of the first edge area and the second edge area.

* * * * *